(12) United States Patent
Wu et al.

(10) Patent No.: US 7,112,838 B2
(45) Date of Patent: Sep. 26, 2006

(54) MULTIPURPOSE METAL FILL

(75) Inventors: Stephen Wu, Fountain Valley, CA (US); Ernie Geronaga, Corona, CA (US)

(73) Assignee: Broadcom Corporation, Irvine, CA (US)

( * ) Notice: Subject to any disclaimer, the term of this patent is extended or adjusted under 35 U.S.C. 154(b) by 234 days.

(21) Appl. No.: 10/814,421

(22) Filed: Mar. 31, 2004

(65) Prior Publication Data

US 2005/0224885 A1 Oct. 13, 2005

(51) Int. Cl.
*H01L 29/92* (2006.01)
(52) U.S. Cl. ................ 257/300; 257/532; 257/E27.048
(58) Field of Classification Search ................ 257/296, 257/300, 368, 532, E27.03, E27.034, E27.048
See application file for complete search history.

(56) References Cited

U.S. PATENT DOCUMENTS

| | | | | |
|---|---|---|---|---|
| 4,570,331 A | * | 2/1986 | Eaton et al. | 438/241 |
| 4,959,650 A | * | 9/1990 | Moyal | 341/126 |
| 5,587,329 A | * | 12/1996 | Hseuh et al. | 438/30 |
| 5,654,984 A | * | 8/1997 | Hershbarger et al. | 375/257 |
| 5,870,046 A | * | 2/1999 | Scott et al. | 341/43 |
| 6,066,537 A | * | 5/2000 | Poh | 438/393 |
| 6,104,794 A | * | 8/2000 | Hein et al. | 379/387.01 |

* cited by examiner

*Primary Examiner*—Allan R. Wilson
(74) *Attorney, Agent, or Firm*—Garlick Harrison & Markison; James A. Harrison

(57) ABSTRACT

The present invention adds a plurality of substrate barriers for reducing substrate noise. The barriers, consisting of a plurality of equally sized n-well regions formed within the p-substrate, are formed between the analog and digital portions and on at least one side of sensitive analog circuits. A MOSFET transistor configured as a capacitor is formed within each of the n-well regions and is coupled between supply and circuit common to filter supply noise. A metal layer capacitor is formed above each MOSFET capacitor and is coupled between supply and circuit common. The present inventive circuit adds metallization to satisfy metal percentage requirements and to improve noise filtering. Each barrier region includes a plurality of coupled (shorted) n-wells with MOSFET transistors configured as capacitors. Additionally, in the described embodiment, the metallization layer is formed to create metal capacitors on top layers of the n-well regions to create additional noise filtering between supply and ground.

20 Claims, 9 Drawing Sheets mixed signal integrated circuit transceiver 100

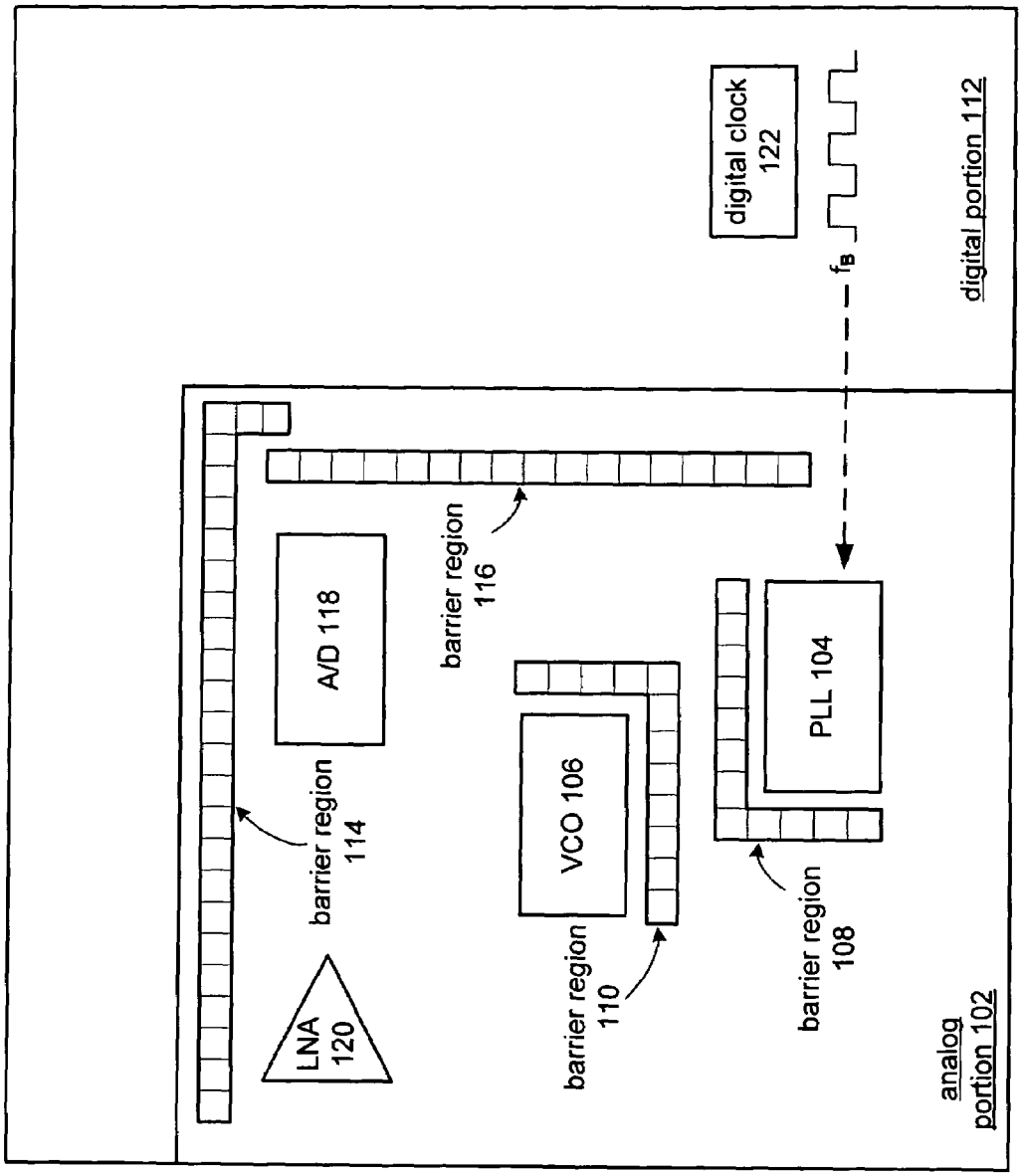
FIG. 5  mixed signal integrated circuit transceiver 100

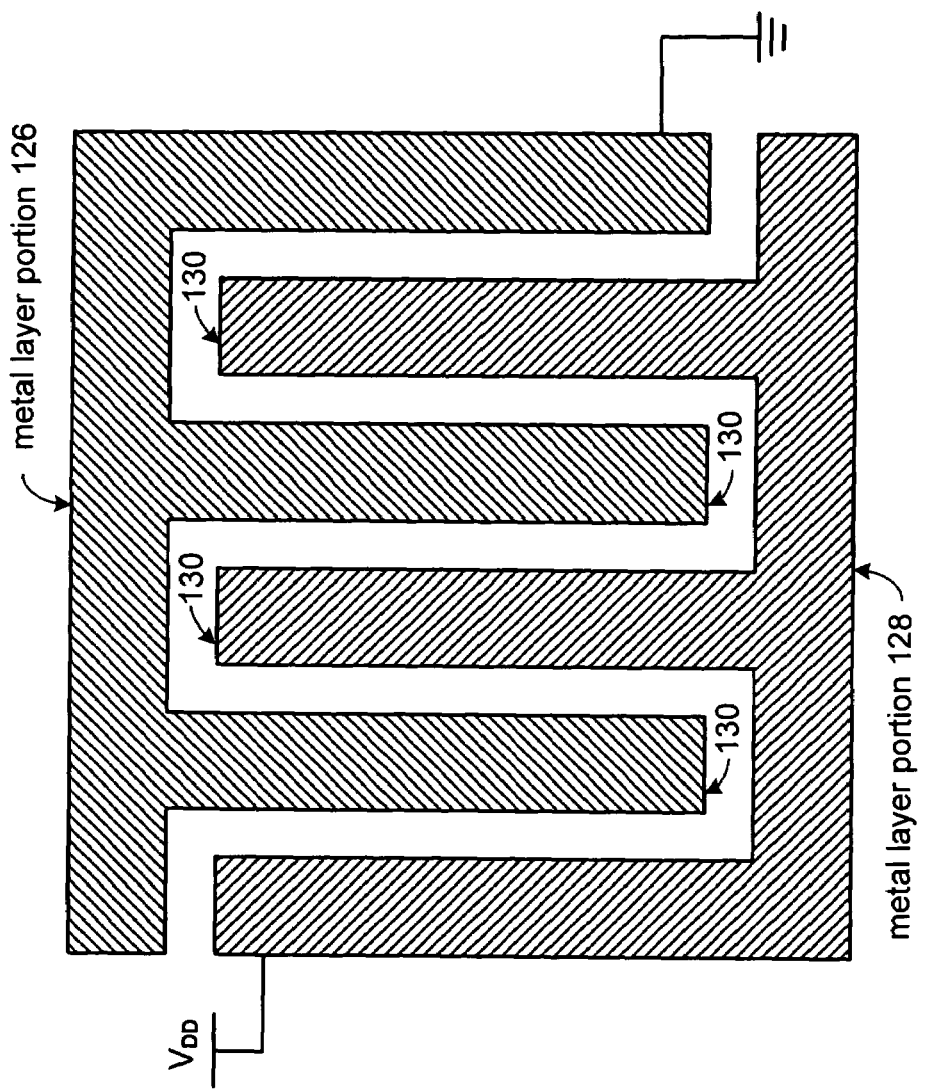
FIG. 6 metal layer capacitor 124 top view

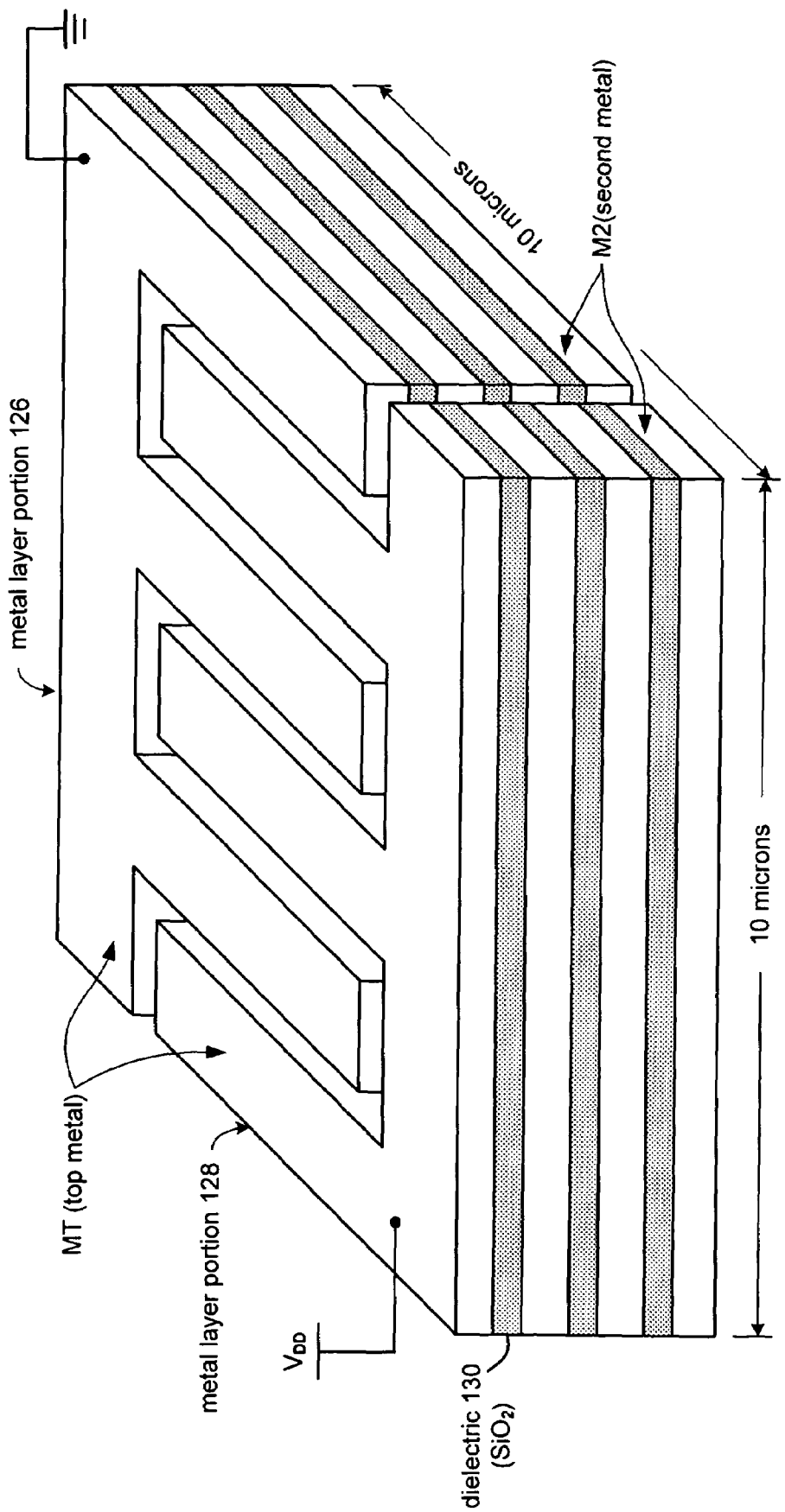
FIG. 7 metal layer capacitor 124 perspective view

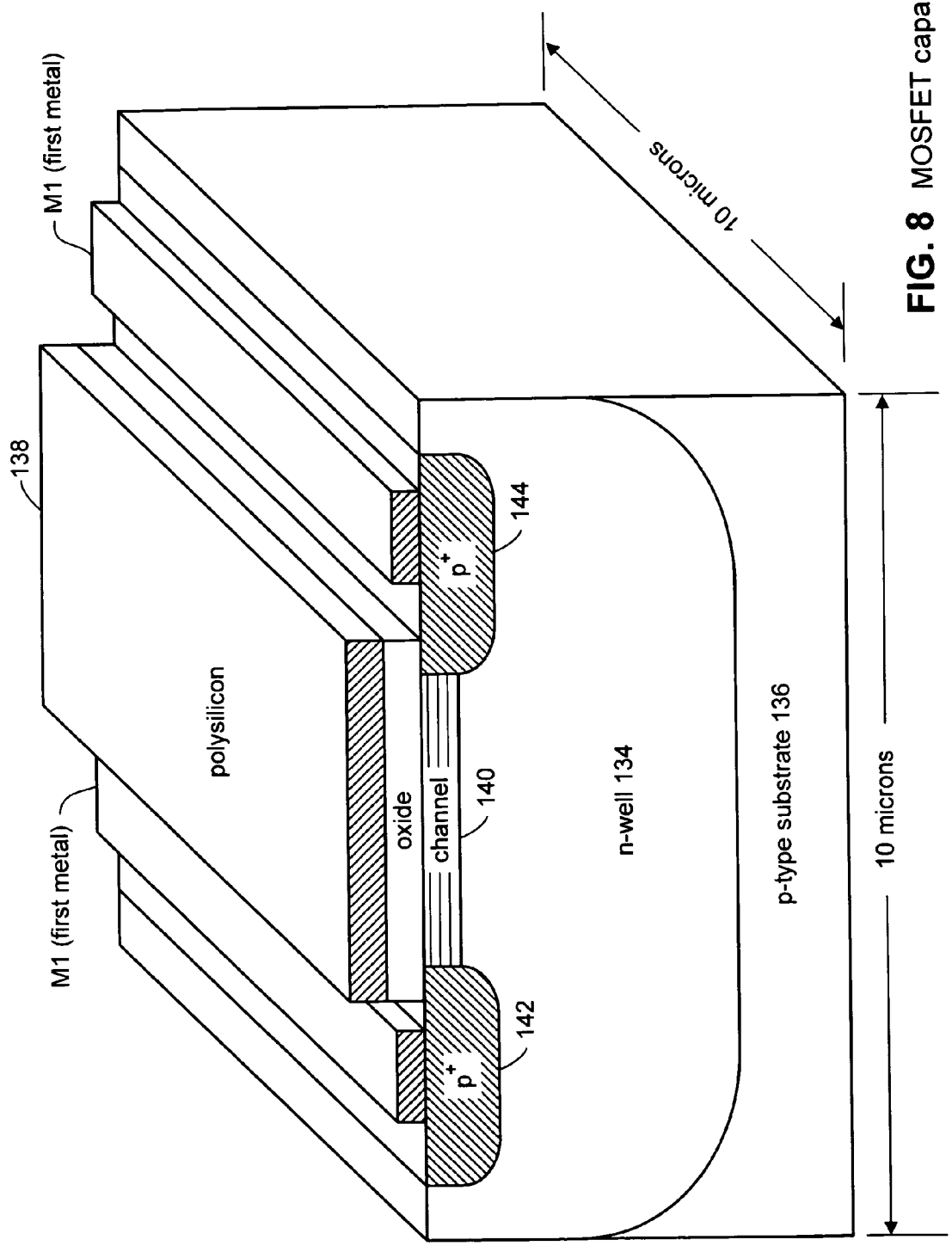
FIG. 8 MOSFET capacitor 132

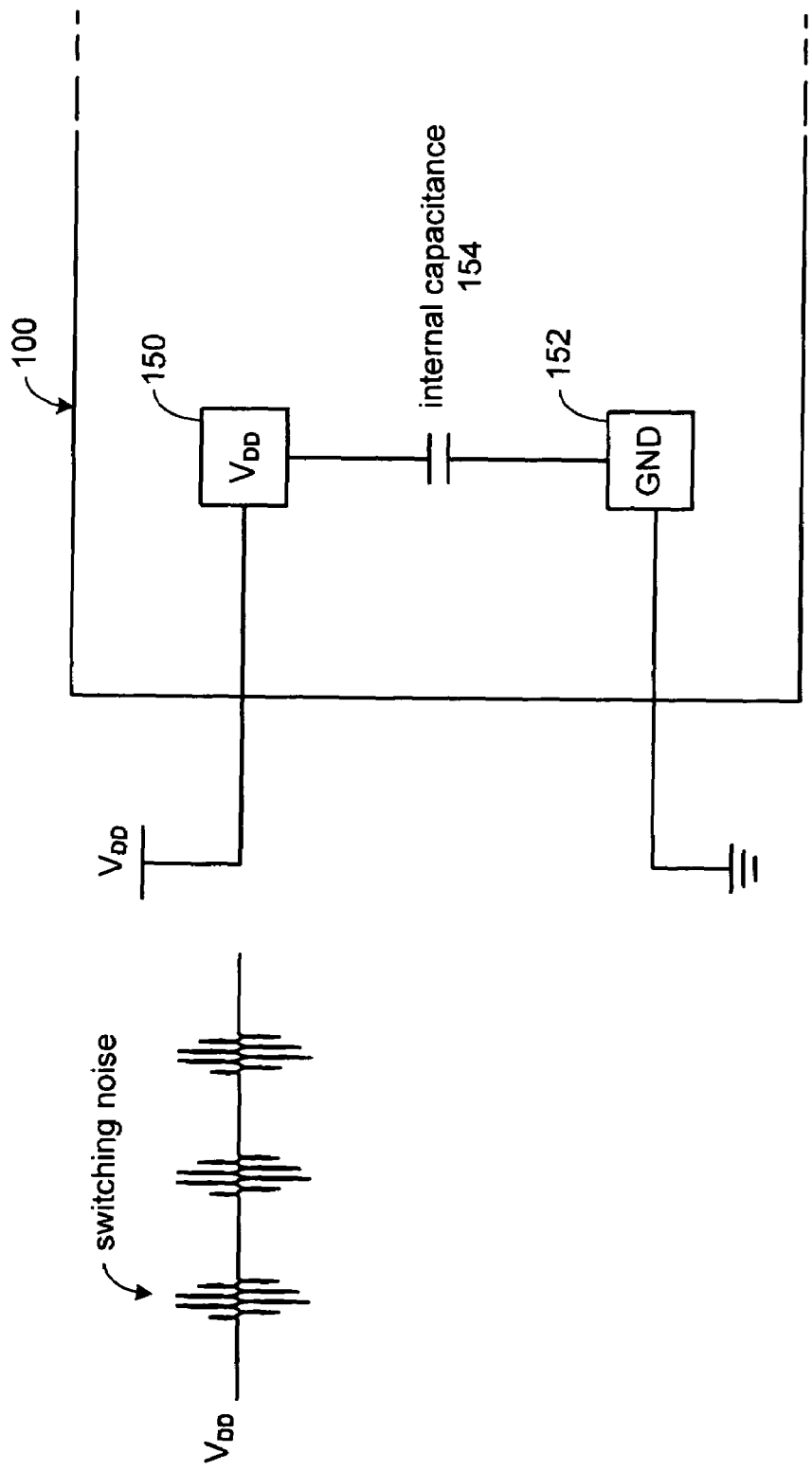
FIG. 9 supply and ground

MULTIPURPOSE METAL FILL

BACKGROUND

1. Technical Field

The present invention relates to wireless communications and, more particularly, wideband wireless communication systems.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, Advanced Mobile Phone Services (AMPS), digital AMPS, Global System for Mobile Communications (GSM), Code Division Multiple Access (CDMA), Local Multipoint distribution systems (LMDS), Multipoint Multichannel Distribution Services (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a Public Switched Telephone Network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. As used herein, the term "low IF" refers to both baseband and intermediate frequency signals. A filtering stage filters the low IF signals to attenuate unwanted out of band signals to produce a filtered signal. The data recovery stage recovers raw data from the filtered signal in accordance with the particular wireless communication standard. Alternate designs being pursued at this time further include direct conversion radios that produce a direct frequency conversion often in a plurality of mixing steps or stages.

Active mixers used in direct conversion radios, as well as radios that employ an intermediate conversion step, typically comprise input transconductance elements, switches and an output load. These active mixers often have varying output signal characteristics due to environmental conditions, such as temperature, and process and manufacturing variations. These varying output signal characteristics can, for example, result in a mixer producing an errant local oscillation signal that affects the accuracy of an output signal's frequency. Having inaccurate output frequencies can result in many undesirable outcomes, including unwanted signal filtering by a downstream filter. Accordingly, using active mixers that can compensate for the effects of frequency drift that is often present is beneficial. Some current mixers being designed have multiple stages for these and other reasons. Mixers that are designed to have multiple stages, however, utilize significant IC real estate. As the pressure to reduce device sizes continues to drive design, a continuing need exists for multiple mixer stage designs that are more efficient in terms of design and power consumption.

As described above, the trend is to integrate increasing levels of functionality on a single chip. As such, analog circuits, including, for example, analog-to-digital converter circuits, are integrated on the same silicon substrate as digital signal processing circuits to create so-called mix-signal circuits. The integration of analog and digital circuits on one silicon substrate causes substrate noise coupling problems. More specifically, the performance of analog circuits degrades due to substrate noise generated by the digital circuits. For example, clocks utilized on the digital portions of the integrated circuit often produce harmonic tones that propagate through the silicon substrate which cause interference in those analog circuits that perform clock related functions. For example, the harmonic signals from a digital clock may readily interfere with VCO circuits and, more generally, with phase-locked loop circuits.

Substrate noise coupling originates from several sources in addition to harmonic spurs from digital clock related functions. Substrate noise may be generated by the digital circuits propagated through the substrate and impact the analog circuits as well as from capacitive and inductive coupling from any device or block within an integrated circuit. One suspected circuit element that is susceptible to such substrate noise, more specifically, is long interconnect lines that drive high frequency switching clocks. Without a proper solution, such noise can degrade performance dramatically and, in some cases, even destroy a particular functionality. Several techniques have been used to address the problems that arise from substrate noise. Analog circuits are often designed to be adequately robust to withstand the digital noise. Types of techniques that may be utilized include physical separation, using differential architectures, and simulation to develop specific counter measures against detected sources of substrate noise. Another approach is to form deep N-wells. This approach, however, is not always available due to design constraints and has its own costs associated therewith. What is needed, therefore, are integrated circuit designs that reduce substrate noise without creating undue inefficiency and without wasting IC real estate.

SUMMARY OF THE INVENTION

As market forces drive electronic devices, such as mixed signal integrated circuit transceivers, to higher speeds and smaller sizes, maintaining acceptable signal separation between the digital and analog portions of the electronic devices challenges circuit designers. A particular problem is the substrate noise due to harmonics generated by digital clocks within the digital portions. More specifically, the digital clocks contain a plurality of higher order harmonics that couple into supply lines and the semi-conductor substrate from long interconnect lines that drive high frequency switching circuits. As the harmonics propagate through the substrate they impact the analog circuits with bandwidths encompassing the harmonics. Thus, one aspect of the present invention is to substantially block or attenuate the substrate noise.

One embodiment of the present invention includes adding substrate barriers for reducing substrate noise, the barriers being formed between the analog and digital portions and also formed on at least one side of sensitive circuits within the analog portion of the mixed signal integrated circuit. The barrier includes a plurality of equally sized and coupled (shorted) n-well regions formed within the p-substrate, wherein the n-well region blocks or attenuates substrate clock pulses of the digital clock. Each of the plurality of constant length and constant width (relative to a top view) n-well regions has a MOSFET transistor configured as a capacitor formed within the n-well region. The MOSFET capacitor is coupled between a supply and circuit common to filter supply noise. The barrier further includes a metal layer capacitor formed above each MOSFET capacitor, wherein the metal layer capacitor is also coupled between supply and circuit common. In one embodiment of the present invention, the n-well regions are formed with a length of 10 microns and a width of 10 microns. The n-well regions are repeated in series to provide a barrier to substantially isolate the analog and digital portions. The n-well with the p-substrate substantially filters the substrate noise, and in one embodiment of the present invention, provides 20 dB of attenuation. Utilizing a plurality of n-wells that are coupled is advantageous because of the modularity of the design. Alternatively, however, a single and larger n-well may be formed.

Many integrated circuits require certain percentages of metal, polysilicon, and oxide density. Accordingly, many regions of metal-fill are included to satisfy metallization requirements. One aspect of the present inventive circuit adds metallization to satisfy metal percentage requirements as well as to improve noise filtering. Accordingly, in the described embodiment, each of the barrier regions are sectioned off to include a plurality of shorted n-wells in which MOSFET transistors are created and configured as capacitors. Additionally, in the described embodiment, the metallization layer is formed to create metal capacitors on a top layer of the n-well regions (or upon one of a plurality of upper layers) to create additional noise filtering between a supply and ground. Accordingly, the barrier regions are created not only to reduce substrate noise, but are formed to create MOSFET and metal layer capacitors that may be coupled between supply and ground to reduce power supply noise. The metal layer capacitors are formed by a series of metal and dielectric layers with separate metal regions coupled to supply and to circuit common.

BRIEF DESCRIPTION OF THE DRAWINGS

A better understanding of the present invention can be obtained when the following detailed description of the preferred embodiment is considered with the following drawings, in which:

FIG. 5 is a functional block diagram of a mix signal integrated circuit transceiver including an analog circuit portion, a digital circuit portion, and a plurality of barrier regions that are utilized to block substrate noise according to one embodiment of the present invention;

FIG. 6 is a top view of a metal layer capacitor formed according to one embodiment of the present invention;

FIG. 7 is a perspective view of a metal layer capacitor according to one embodiment of the present invention;

FIG. 8 is a perspective view of a MOSFET capacitor and is exemplary of a MOSFET capacitor formed within an n-well within a p-substrate of a barrier region according to one embodiment of the present invention;

FIG. 9 is a functional schematic block diagram of a supply and ground within a mixed signal integrated circuit transceiver according to one embodiment of the present invention.

DETAILED DESCRIPTION OF THE DRAWINGS

Figure 1:
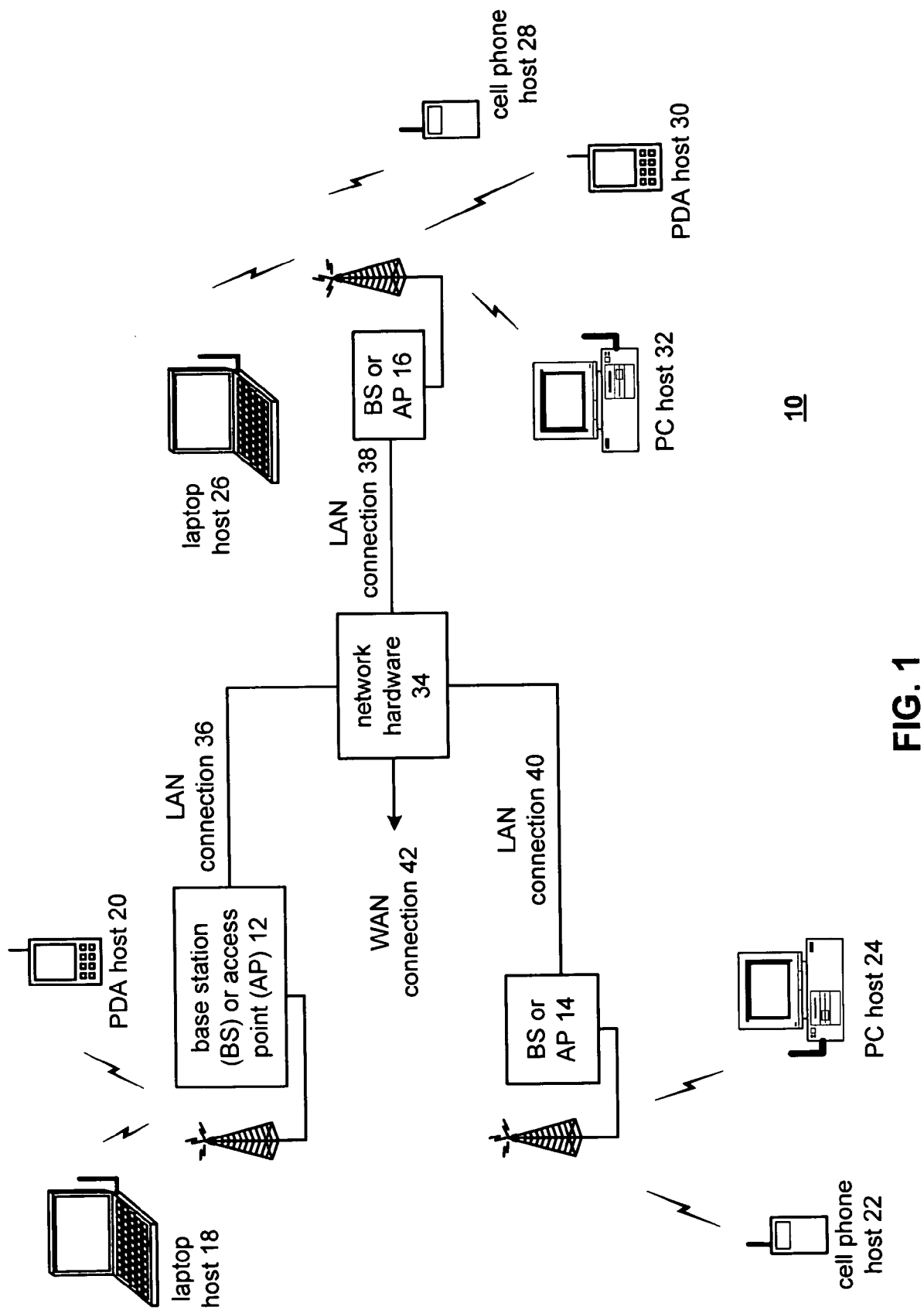
FIG. 1 is a functional block diagram illustrating a communication system that includes a plurality of base stations or access points, a plurality of wireless communication devices and a network hardware component.

FIG. 1 is a functional block diagram illustrating a communication system 10 that includes a plurality of base stations or access points (AP) 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10. Each of the base stations or access points 12–16 has an associated antenna or antenna array to communicate with the wireless communication devices in its area. Typically, the wireless communication devices 18–32 register with the particular base station or access points 12–16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 2:
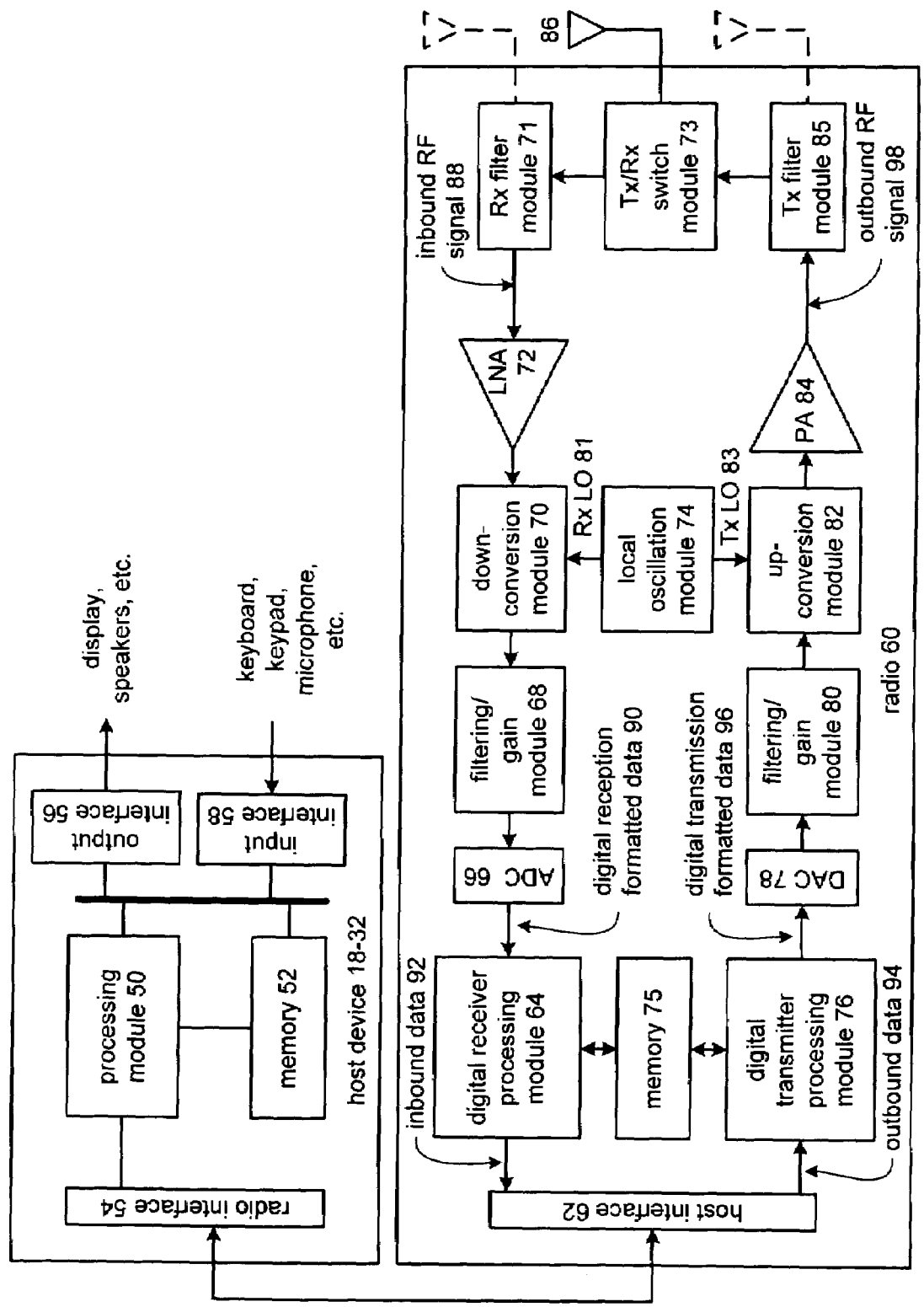
FIG. 2 is a schematic block diagram illustrating a wireless communication device as a host device and an associated radio.

FIG. 2 is a schematic block diagram illustrating a wireless communication device 18–32 as a host device and an associated radio 60. For cellular telephone hosts, the radio 60 is a built-in component. For personal digital assistant hosts, laptop hosts, and/or personal computer hosts, the radio 60 may be built-in or an externally coupled component.

As illustrated, the host wireless communication device 18–32 includes a processing module 50, a memory 52, a radio interface 54, an input interface 58 and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/Rx) switch module 73, a local oscillation module 74, a memory 75, a digital transmitter processing module 76, a digital-to-analog converter 78, a filtering/gain module 80, an IF mixing up-conversion module 82, a power amplifier 84, a transmitter filter module 85, and an antenna 86. The antenna 86 is shared by the transmit and receive paths as regulated by the Tx/Rx switch module 73. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and/or modulation. The digital receiver and transmitter processing modules 64 and 76 may be implemented using a shared processing device, individual processing devices, or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the digital receiver processing module 64 and/or the digital transmitter processing module 76 executes, operational instructions corresponding to at least some of the functions illustrated herein.

In operation, the radio 60 receives outbound data 94 from the host wireless communication device 18–32 via the host interface 62. The host interface 62 routes the outbound data 94 to the digital transmitter processing module 76, which processes the outbound data 94 in accordance with a particular wireless communication standard (e.g., IEEE 802.11a, IEEE 802.1 1b, Bluetooth, etc.) to produce digital transmission formatted data 96. The digital transmission formatted data 96 will be a digital baseband signal or a digital low IF signal, where the low IF typically will be in the frequency range of 100 kilohertz to a few megahertz.

The digital-to-analog converter 78 converts the digital transmission formatted data 96 from the digital domain to the analog domain. The filtering/gain module 80 filters and/or adjusts the gain of the analog baseband signal prior to providing it to the up-conversion module 82. The up-conversion module 82 directly converts the analog baseband signal, or low IF signal, into an RF signal based on a transmitter local oscillation signal 83 provided by local oscillation module 74. Local oscillation module 74 is, in one embodiment of the invention, a multi-stage mixer as described herein. The power amplifier 84 amplifies the RF signal to produce an outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch module 73, where the Rx filter module 71 bandpass filters the inbound RF signal 88. The Rx filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation signal 81 provided by local oscillation module 74. Local oscillation module 74 is, in one embodiment of the invention, a multi-stage mixer as described herein. The down-conversion module 70 provides the inbound low IF signal or baseband signal to the filtering/gain module 68. The filtering/gain module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host wireless communication device 18–32 via the radio interface 54.

As one of average skill in the art will appreciate, the wireless communication device of FIG. 2 may be implemented using one or more integrated circuits. For example, the host device may be implemented on a first integrated circuit, while the digital receiver processing module 64, the digital transmitter processing module 76 and memory 75 are implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver processing module 64 and the digital transmitter processing module 76 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

The wireless communication device of FIG. 2 is one that may be implemented to include either a direct conversion from RF to baseband and baseband to RF or for a conversion by way of a low intermediate frequency. In general, the device of FIG. 2 is formed in a silicon substrate, however, that can carry undesirable substrate noise. Accordingly, for noise sensitive circuit components such as PLL and VCO circuit blocks, a substrate barrier as described herein may be formed to reduce, for example, noise from a digital clock. The substrate barriers, as will be described in greater detail below, further include capacitor configured MOSFET devices that may be used in filtration circuitry to further reduce noise and improve filtering.

Figure 3:
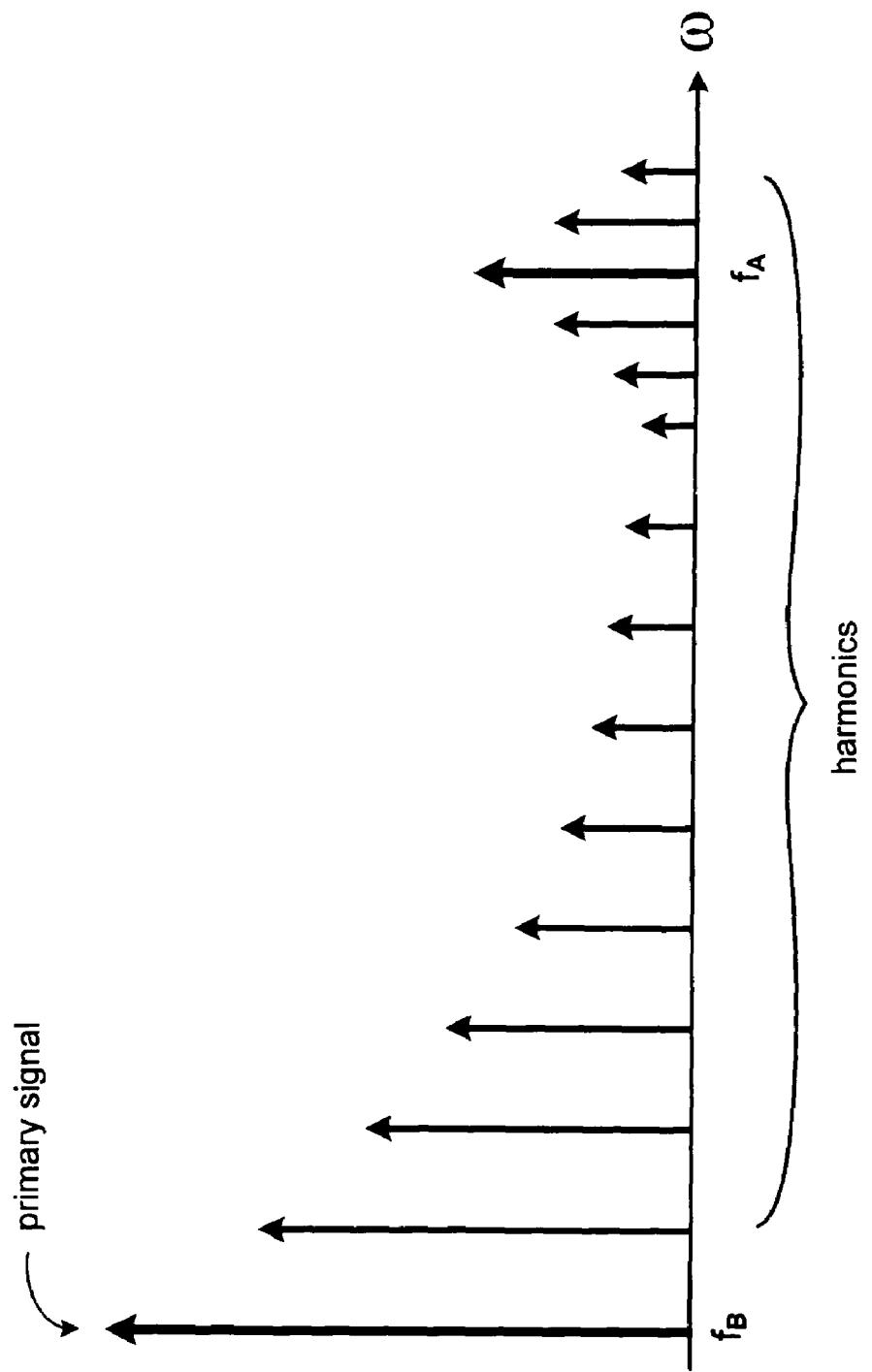
FIG. 3 is a signal diagram illustrating a plurality of harmonic signals for a digital clock and that such harmonics may be amplified within an analog portion of a mixed signal device.

FIG. 3 is a signal diagram illustrating a plurality of harmonic signals for a digital clock and that such harmonics may be amplified within an analog portion of a mixed signal device. As may be seen, a primary signal at a frequency $f_B$ includes a series of harmonics. If, for example, the primary signal, or fundamental frequency, is a digital clock signal from a digital portion of a mixed signal integrated circuit, then each harmonic is a high order multiple and lower amplitude component of the fundamental frequency of the digital clock. Because the transceiver device (radio 60 of FIG. 2, for example) represented by FIG. 3 is a mixed signal device, however, analog portions of the transceiver circuit include amplifiers that operate at a specified frequency, frequency $f_A$ for example.

Such amplifiers may receive and amplify the higher order harmonics within the bandwidth of the specified frequency if such harmonics are propagated through a substrate of the mixed signal integrated circuit transceiver, however. Thus, as may be seen, in the example of FIG. 3, higher order harmonics are present with the bandwidth of frequency $f_A$ and are amplified along with the frequency components of $f_A$. Because of the tendency of an analog circuit to amplify harmonics and other substrate noise, it is desirable to block or reduce such substrate noise in the region of any sort of amplifier. It is especially advantageous to reduce such harmonics for clock based analog circuits that may well operate at a frequency of a generated harmonic signal.

Figure 4:
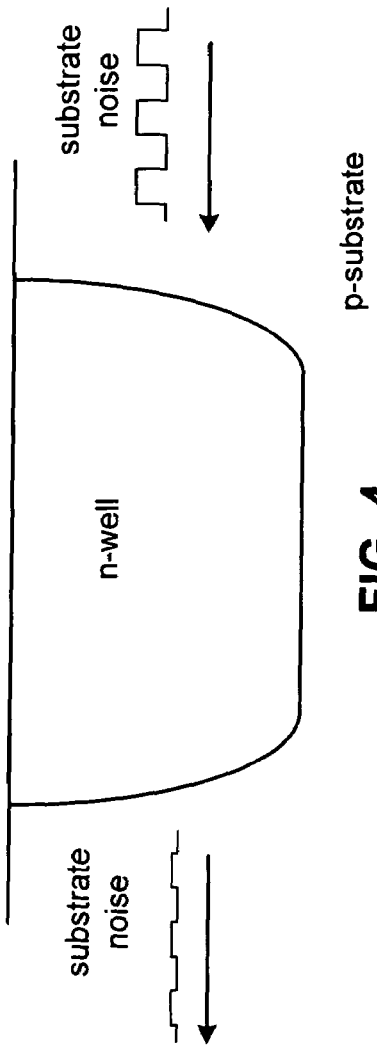
FIG. 4 is a side view of a substrate that includes a well for reducing substrate noise.

FIG. 4 is a side view of a substrate that includes a well for reducing substrate noise. More specifically, as may be seen, the n-well in a p-substrate is used to reduce a substrate noise source generated by a digital clock. As may be seen, a digital clock signal propagating through the p-substrate, on the right-hand side of the n-well, propagates into the n-well wherein it is substantially filtered. In one embodiment of the present invention, an n-well is selected to provide 20 dB of attenuation of the substrate noise generated by a digital clock.

FIG. 5 is a functional block diagram of a mixed signal integrated circuit transceiver including an analog circuit portion, a digital circuit portion, and a plurality of barrier regions that are utilized to block substrate noise according to one embodiment of the present invention. Referring to FIG. 5, a mixed signal integrated circuit transceiver 100 includes analog circuits within an analog portion 102 of transceiver 100 that are particularly sensitive to substrate noise produced by other circuit blocks. More specifically, a phase-locked loop (PLL) 104 and a voltage controlled oscillator (VCO) 106 both include barrier regions formed on at least two sides so as to reduce substrate noise generated by the PLL 104 or VCO 106, respectively, and to reduce substrate noise that is received by the PLL 104 or VCO 106, respectively. As may also be seen, PLL 104 specifically includes a barrier region 108 formed on two sides of PLL 104, while VCO 106 includes a barrier region 110 formed on two sides of VCO 106. In the described example, the two protected sides are the ones that could possibly receive substrate noise from the other or produce substrate noise to the other. Additionally, two barrier portions are formed along the perimeter of analog portion 102 to insulate the analog circuits there within from substrate noise generated within digital portion 112 by a digital clock 122. More specifically, a barrier region 114 is formed along a first boundary between the analog portion 102 and digital portion 112 and a barrier region 116 is formed along a second boundary between analog portion 102 and digital portion 112. Thus, analog-to-digital converter (A/D) 118 and low noise amplifier (LNA) 120 will both experience reduced levels of substrate noise from digital clock 122 of digital portion 112. The VCO 106 and PLL 104 also experience reduced substrate noise due to barrier regions 114 and 116.

The specific configurations and arrangements of such barrier regions, namely, barrier regions 108, 110, 114, and 116, are a matter of design choice and are shown here in the configuration of FIG. 5 as exemplary only. Moreover, each of the circuits, namely, the PLL 104, the VCO 106, the A/D 118 and the LNA 120, are all exaggerated in terms of size. Generally, an analog portion, such as analog portion 102, is much larger in size, relatively, and is typically sectioned into a large number of circuit blocks for which certain design requirements exist. For example, in some circuits an analog portion, such as analog portion 102, is sectioned into blocks that are equal in length on any one side. For each of these blocks, certain requirements exist in terms of required percentages of metal, polysilicon, and oxide density. One of average skill in the art may readily determine appropriate dimensions. Generally, manufacturers establish specified percentages of metal and polysilicon that must be maintained. Manufacturers of integrated circuit designs typically require these percentages of metal and polysilicon in order to guarantee that certain design and/or test tools operate properly.

Accordingly, many integrated circuits include regions of metal-fill to satisfy the metallization requirements. The present inventive circuit, however, not only attempts to add metallization to satisfy metal percentage requirements, but also to improve noise filtering. Accordingly, in the described embodiment, each of the barrier regions are sectioned off to include a plurality of n-wells in which MOSFET transistors are created and configured as capacitors. Additionally, in the described embodiment, the metallization layer is formed to create metal capacitors on a top layer of the n-well regions to create additional noise filtering between a supply and ground. Accordingly, the barrier regions are created not only to reduce substrate noise, but are formed to create MOSFET and metal layer capacitors that may be coupled between supply and ground to reduce power supply noise.

FIG. 6 is a top view of an exemplary metal layer capacitor implemented in an integrated circuit according to one embodiment of the present invention. As may be seen, a metal layer capacitor 124 includes a first metal layer portion 126 that is coupled to ground and a second metal layer portion 128 that is coupled to supply ($V_{DD}$). As may further be seen, each metal layer portion 126 and 128 includes a plurality of intergraly overlapping fingers 130. From a top view, the overlapping fingers 130 are separated by space. In the described embodiment of the invention, when viewed from a top view, the metal layer capacitor is approximately 10 microns wide on each side.

FIG. 7 is a perspective view of metal layer capacitor 124 according to one embodiment of the present invention. As may further be seen, metal layer capacitor 124 includes a plurality of metal layers, each having a metal layer portion 126 coupled to ground and a metal layer portion 128 coupled to supply. Each of the metal layer portions is separated from the metal layer portions either above or below it by dielectric 130. As such, metal layer capacitor 124 helps satisfy metal-fill requirements discussed above, while also providing additional capacitors that filter power supply noise. As may further be seen, metal layer capacitor 124 is 10 microns wide on each side.

FIG. 8 is a perspective view of a MOSFET capacitor and is exemplary of a MOSFET capacitor formed within an n-well within a p-substrate of a barrier region according to one embodiment of the present invention. As may be seen, a MOSFET capacitor 132 is formed within an n-well 134 that is formed within a p-type substrate 136. MOSFET capacitor 132 includes a gate 138 that overlays a p-type channel 140 that is displaced between p-type source and drains 142 and 144, respectively. The structure of MOSFET capacitor 132 is generally known.

FIG. 9 is a functional schematic block diagram of a supply and ground within a mixed signal integrated circuit transceiver according to one embodiment of the present invention. As may be seen, mixed signal integrated circuit transceiver 100 includes a supply 150 and a ground 152. Coupled there between supply 150 and ground 152 is internal capacitance 154. Internal capacitance 154 is for shorting noise, such as switching noise, to ground. In the described embodiment of the invention, internal capacitance 154 is created within the barrier regions by MOSFET transistors configured as a capacitor, as well as the metal layer capacitors described herein, in one embodiment of the present invention.

Figure 10:
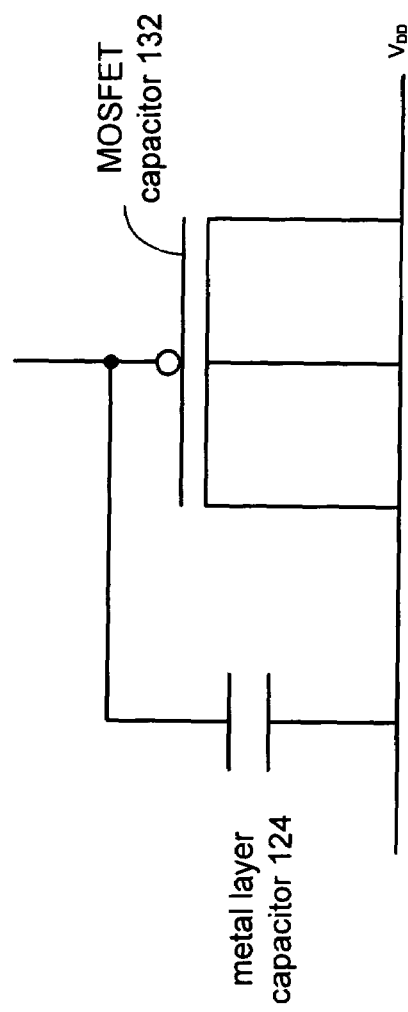
FIG. 10 illustrates that a MOSFET capacitor formed within an n-well of a barrier region is coupled in parallel to a metal layer fringe capacitor, both of which are coupled between supply and ground.

FIG. 10 illustrates that a MOSFET capacitor formed within an n-well of a barrier region is coupled in parallel to a metal layer fringe capacitor, both of which are coupled between supply and ground. In the specific example of FIG. 10, metal layer capacitor 124 is coupled in parallel with MOSFET capacitor 132. As described herein, each of these capacitors may be used in conjunction with a resistor to form additional filtering and for other beneficial applications.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

What is claimed is:

1. A mixed signal integrated circuit transceiver formed on a p-type substrate, comprising:
   digital portion that operates according to a digital clock;
   analog portion tat includes a plurality of circuit blocks that receive the digital clock wherein each of the circuit blocks of the analog portion is formed to satisfy metallization, polysilicon and oxide percentage requirements;
   a metal fill portion within each of the circuit blocks to increase the metallization percentage requirements;
   wherein each of the circuit blocks further comprises:
   a module for performing a specified function; and
   a barrier portion surrounding at least one side of the module, wherein the barrier portion further includes at least one n-well region wherein the at least one n-well region blocks substrate clock pulses of the digital clock and at least one MOSFET capacitor formed within the at least one n-well region.

2. The mixed signal integrated circuit transceiver of claim 1 wherein the barrier portion includes a plurality of n-well regions wherein each of the n-well regions is characterized by a constant length and a constant width relative to a top view.

3. The mixed signal integrated circuit transceiver of claim 2 wherein the constant length is equal to ten microns.

4. The mixed signal integrated circuit transceiver of claim 2 wherein the constant width is equal to ten microns.

5. The mixed signal integrated circuit transceiver of claim 1 further including a metal layer capacitor formed above the at least one MOSFET capacitor.

6. The mixed signal integrated circuit transceiver of claim 5 wherein the metal layer capacitor is coupled between supply and circuit common.

7. A mixed signal integrated circuit transceiver formed on a p-type substrate, comprising:
   digital portion that operates according to a digital clock;
   analog portion that includes a plurality of circuit blocks that receive the digital clock wherein each of the circuit blocks of the analog portion is formed to satisfy metallization, polysilicon and oxide percentage requirements;
   a metal fill portion within each of the circuit blocks to increase the metallization percentage requirements;
   wherein each of the circuit blocks further comprises:
   a module for performing a specified function; and a barrier portion surrounding at least one side of the module, wherein the barrier portion further includes at least one well region wherein the at least one well region blocks substrate clock pulses of the digital clock; and a metal layer capacitor formed above the at least one well region.

8. The mixed signal integrated circuit transceiver of claim 7 wherein each well region is characterized by a constant length and a constant width relative to a top view.

9. The mixed signal integrated circuit transceiver of claim 8 wherein the constant length is equal to ten microns.

10. The mixed signal integrated circuit transceiver of claim 8 wherein the constant width is equal to ten microns.

11. The mixed signal integrated circuit transceiver of claim 7 wherein the well region includes at least one MOSFET capacitor.

12. The mixed signal integrated circuit transceiver of claim 11 wherein the metal layer capacitor is coupled between supply and circuit common.

13. The mixed signal integrated circuit transceiver of claim 11 wherein the at least one MOSFET capacitor is coupled between supply and circuit common.

14. The mixed signal integrated circuit transceiver of claim 11 wherein the at least one MOSFET capacitor is coupled to a current source and a voltage controlled oscillator in a loop filter.

15. A mixed signal integrated circuit transceiver formed on a p-type substrate, comprising:

digital portion that operates according to a digital clock;

analog portion that includes a plurality of circuit blocks that receive the digital clock wherein each of the circuit blocks of the analog portion is formed to satisfy metalization, polysilicon and oxide percentage requirements;

wherein each of the circuit blocks further comprises:

a module for performing a specified function;

a barrier portion surrounding at least one side of the module, wherein the barrier portion further includes a plurality of equally sized n-well regions to reduce substrate noise, wherein each of the n-well regions further includes at least one of a MOSFET capacitor formed within each of the n-well regions and a metal layer capacitor formed above each of the n-well regions; and wherein the least one of the MOSFET capacitor and metal layer capacitor is coupled between a supply and ground;

wherein each of the circuit blocks further comprises:

a module for performing a specified function; and a barrier portion surrounding at least one side of the module, wherein the barrier portion further includes at least one well region wherein the at least one well region blocks substrate clock pulses of the digital clock; and a metal layer capacitor formed above the at least one well region.

16. A clock based circuit block, comprising:

a barrier portion surrounding at least one side of a module for reducing substrate noise, the barrier being formed on at least one side of the clock based circuit block within an analog portion of a mixed signal integrated circuit transceiver, the barrier portion comprising:

a plurality of n-well regions within a p-substrate material; and wherein each of the n-well regions comprises at least one of a MOSFET transistor configured as a capacitor and a metal layer capacitor formed on top of each of the n-well regions.

17. The clock based circuit block of claim 16 wherein each of the n-well regions includes only a MOSFET transistor configured as a capacitor.

18. The clock based circuit block of claim 17 wherein the MOSFET transistor configured as a capacitor is coupled between supply and ground.

19. The clock based circuit block of claim 16 comprising only the metal layer capacitor above each of the n-well regions coupled between supply and ground.

20. The clock based circuit block of claim 16 comprising the metal layer capacitor above each of the n-well regions and further including the MOSFET transistor configured as a capacitor and further wherein both the metal layer capacitor and the MOSFET transistor configured as a capacitor are both coupled between supply and ground.

* * * * *